US009135132B2

(12) United States Patent
Han

(10) Patent No.: US 9,135,132 B2
(45) Date of Patent: Sep. 15, 2015

(54) METHOD OF TESTING A DEVICE UNDER TEST, DEVICE UNDER TEST, AND SEMICONDUCTOR TEST SYSTEM INCLUDING THE DEVICE UNDER TEST

(75) Inventor: Dong Kwan Han, Suwon-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 312 days.

(21) Appl. No.: 13/586,013

(22) Filed: Aug. 15, 2012

(65) Prior Publication Data

US 2013/0073907 A1 Mar. 21, 2013

(30) Foreign Application Priority Data

Sep. 20, 2011 (KR) .................. 10-2011-0094680

(51) Int. Cl.
| | |
|---|---|
| G06F 11/00 | (2006.01) |
| G06F 11/273 | (2006.01) |
| G06F 11/22 | (2006.01) |
| G06F 11/263 | (2006.01) |
| G01R 31/3185 | (2006.01) |
| G06F 11/267 | (2006.01) |

(52) U.S. Cl.
CPC ........ *G06F 11/273* (2013.01); *G01R 31/31858* (2013.01); *G06F 11/2236* (2013.01); *G06F 11/263* (2013.01); *G06F 11/267* (2013.01)

(58) Field of Classification Search
CPC .............. G06F 11/2236; G06F 11/273; G06F 11/2733; G06F 11/263
USPC ......................................... 714/31, 32, 30, 35
See application file for complete search history.

(56) References Cited

U.S. PATENT DOCUMENTS

| 6,861,866 | B2 | 3/2005 | Han | |
|---|---|---|---|---|
| 7,213,171 | B2 * | 5/2007 | Haroun et ........................ | 714/30 |
| 7,536,597 | B2 * | 5/2009 | McGowan ...................... | 714/30 |
| 2002/0184562 | A1 * | 12/2002 | Nadeau-Dostie et al. ...... | 714/30 |
| 2004/0017219 | A1 * | 1/2004 | Han ................................. | 326/16 |
| 2004/0168105 | A1 * | 8/2004 | Haroun et al. .................. | 714/30 |

(Continued)

FOREIGN PATENT DOCUMENTS

| JP | 2004-054892 A | 2/2004 |
|---|---|---|
| JP | 2006-329995 A | 12/2006 |

(Continued)

OTHER PUBLICATIONS

S.K. Goel et al., Optimisation of on-chip design-for-test-infrastructure for maximal multi-site test throughput, IEE Proc. Comput. Digit. Tech. vol. 152 No. 3, May 2005, pp. 442-456.

*Primary Examiner* — Joshua Lohn
(74) *Attorney, Agent, or Firm* — Lee & Morse, P.C.

(57) ABSTRACT

A method of testing a plurality of DUTs includes providing a plurality of shift registers to test a plurality of cores in each DUT, supplying test input data, a test mode input signal, a test clock signal, and a test reset signal to the shift registers and cores, receiving a master bit, a first control value, and a second control value, based on the test input data and the test mode input signal, according to the test clock signal and the test reset signal, selecting at least one core and a test method, according to the first control value, selecting a target DUT according to the master bit or the second control value, simultaneously testing and debugging the selected core according to the test method, and outputting the test data output of the target DUT to check a result of the testing when an output enable signal is received.

18 Claims, 9 Drawing Sheets

(56) References Cited

U.S. PATENT DOCUMENTS

| | | | |
|---|---|---|---|
| 2005/0262396 A1* | 11/2005 | Woodward et al. | 714/30 |
| 2006/0248395 A1* | 11/2006 | McGowan | 714/30 |
| 2006/0270357 A1 | 11/2006 | de la Puente, Sr., et al. | |
| 2008/0281547 A1* | 11/2008 | Nakamura et al. | 702/120 |
| 2008/0320331 A1* | 12/2008 | Nakatani et al. | 714/35 |
| 2013/0073907 A1* | 3/2013 | Han | 714/32 |

FOREIGN PATENT DOCUMENTS

| | | |
|---|---|---|
| JP | 2008-310792 A | 12/2008 |
| KR | 10-2004-0009415 A | 1/2004 |
| KR | 10-2006-0122757 A | 11/2006 |

\* cited by examiner

US 9,135,132 B2

METHOD OF TESTING A DEVICE UNDER TEST, DEVICE UNDER TEST, AND SEMICONDUCTOR TEST SYSTEM INCLUDING THE DEVICE UNDER TEST

CROSS-REFERENCE TO RELATED APPLICATIONS

This application claims the benefit of Korean Patent Application No. 10-2011-0094680, filed on Sep. 20, 2011, in the Korean Intellectual Property Office, the disclosure of which is incorporated herein in its entirety by reference.

BACKGROUND

1. Field

One or more aspects of the inventive concept relate to a semiconductor test system and a method of controlling the same, and more particularly, to a semiconductor test system that includes cores and devices under test (DUTs) that are subject to the IEEE 1149.1 standards and the IEEE 1500 standards.

2. Description of the Related Art

The application specific integrated circuit (ASIC) technology has been developed from the concept of a chipset system to the concept of a system on chip (SoC) based on built-in cores. A SoC integrated circuit includes various functional blocks, e.g., a microprocessor, an interface, a memory array, and/or a digital signal processor (DSP). Such a functional block that has been designed and tested is referred to as a 'core'.

Even if a plurality of cores are individually tested and are determined as normally operating, the plurality of cores may operate abnormally when they are installed in a SoC. Thus, operations of the plurality of cores should be tested again after they are installed in the SoC.

Various methods, e.g., a built-in self test (BIST), test data compression (TDC), and a multi-site test, have been used for testing DUTs, e.g., a SoC. However, as the BIST and TDC require overheads of relatively large design automatic test equipment (ATE), the BIST and the TDC may be limited to testing SoCs for particular purposes. Further, as the multi-site test performs simultaneous testing of N SoCs, the testing costs may be relatively large, i.e., costs for testing one SoC may be 1/N of the cost of testing N SoCs.

SUMMARY

According to an aspect of the inventive concept, there is provided a method of testing a plurality of DUTs, each DUT including a plurality of cores, the method including providing a plurality of shift registers to test the plurality of cores, supplying a test input data, a test mode input signal, a test clock signal, and a test reset signal to the plurality of shift registers and the plurality of cores, receiving a master bit, a first control value, and a second control value, based on the test input data and the test mode input signal from the plurality of shift registers, according to the test clock signal and the test reset signal, selecting at least one core from among the plurality of cores and a test method, according to the first control value, selecting a target DUT that is to output test data output from among the plurality of DUTs, according to the master bit or the second control value, simultaneously testing and debugging the selected at least one core according to the test method, and outputting the test data output of the target DUT to check a result of the testing when an output enable signal is received.

Providing the plurality of shift registers may include providing a first group including at least one most significant bit (MSB) shift register from among the plurality of shift registers, the first group outputting the master bit, providing a second group including at least one least significant bit (LSB) shift register from among the plurality of shift registers, the second group outputting the second control value, and providing a third group including at least one remaining shift register from among the plurality of shift registers, except for the at least one shift register belonging to each of the first and second groups, the third group outputting the first control value.

Each of the plurality of shift registers may include a first multiplexer and a flip flop, and performs a linear feedback shift operation.

Selecting the target DUT may include connecting the plurality of cores in a daisy-chain fashion, and selecting the at least one core and the test method according to a core selection signal obtained by decoding the first control value.

If the master bit is received, selecting the target DUT may be performed according to the master bit when the output enable signal is received.

According to another aspect of the inventive concept, there is provided a DUT, including four input pins configured to receive input signals, the input signals including a test input data signal, a test mode input signal, a test clock signal, and a test reset signal, one output pin configured to output test data output, a plurality of cores configured to execute operations corresponding to the input signals received via the four input pins, and to output the test data output, a chip-level tap controller configured to control an entire test process including transmitting a test command, the test data output, and an output enable signal based on the input signals, a star controller configured to perform a linear feedback shift operation on the test input data signal and the test mode input signal, according to the test clock signal and the test reset signal, to obtain a first control value, to select at least one core to be tested from among the plurality of cores and a test method, based on the first control value, to test the selected at least one core according to the test method to obtain a second control value, and to select a target DUT, which is to output the test data output, based on the second control value or a master bit, and a 3-phase buffer configured to output the test data output of the target DUT, based on the output enable signal.

The star controller may include a plurality of shift registers, each performing the linear feedback shift operation on the test input data signal and the test mode input signal, according to the test clock signal and the test reset signal, an external controller including a first group and a second group, and outputting a DUT selection signal for selecting the target DUT according to the second control value or the master bit when the output enable signal is input to the external controller, wherein the first group includes at least one most significant bit (MSB) shift register from among the plurality of shift registers, and outputs the master bit, and the second group includes at least one least significant bit (LSB) shift register from among the plurality of shift registers, and outputs the second control value, and an internal controller including a third group and a decoder, the internal controller being configured to control at least one core, which is to be tested, to be selected from among M cores, to control a test method to be selected, and to control the selected at least one core to be tested according to the test method, wherein the third group includes at least one remaining shift register from among the plurality of shift registers, except for the at least one shift register belonging to each of the first and second groups, and outputs the first control value, and wherein the decoder decodes the first control value and outputs M core selection signals.

The internal controller may further include a plurality of first multiplexers configured to connect the chip-level tap controller and the M cores, each of the plurality of first multiplexers being configured to select the at least one core to be tested from among the M cores and the test method, according to the M core selection signals.

Each of the plurality of first multiplexers may be configured to bypass a test data output of a corresponding core from among the M cores or to supply the test data output to a following core connected to the corresponding core in a daisy-chain fashion, according to one of the M core selection signals.

Each of the plurality of shift registers may include a second multiplexer and a flip flop, and performs the linear feedback shift operation.

If the DUT is selected according to the second control value, the external controller may further include a chip identification (ID) register for storing a chip ID, and a comparing unit for comparing the chip ID with the second control value and then outputting a DUT selection signal, when the output enable signal is input to the comparing unit.

If the DUT is selected according to the master bit, the comparing unit may determine whether the DUT is to be selected, according to the master bit and then outputs the DUT selection signal, when the output enable signal is input to the comparing unit.

The plurality of shift registers may be linear feedback shift registers, the plurality of shift registers shift the test input data signal and the test mode input signal when the test reset signal is activated, and hold the test input data signal and the test mode input signal when the test reset signal is deactivated.

A semiconductor test system may include an automatic test equipment, and the DUTs, wherein the plurality of DUTs are packaged according to at least one of a through silicon via (TSV) technique, a system-in-package (SIP) technique, or a multi-chip package (MCP) technique.

A semiconductor system may include DUT.

According to another aspect of the inventive concept, there is provided a DUT, including four input pins configured to receive input signals, the input signals including a test input data signal, a test mode input signal, a test clock signal, and a test reset signal, one output pin configured to output test data output, a plurality of cores configured to execute operations in accordance with the input signals and to output the test data output, a star controller configured to perform a shift operation on the test input data signal and the test mode input signal, according to the test clock signal and the test reset signal, to obtain a first control value, to select at least one core of the plurality of cores and a test method, based on the first control value, to test the selected at least one core according to the test method to obtain a second control value, and to select a target DUT, based on the second control value or a master bit, and a 3-phase buffer configured to output the test data output of the target DUT.

The 3-phase buffer may be configured to output the test data output of the target DUT in accordance with an output enable signal generated by a chip-level tap controller based on the input signals.

The star controller may include a plurality of shift registers configured to perform linear feedback shift operation on the test input data signal and the test mode input signal according to the test clock signal and the test reset signal, the plurality of shift registers being divided into a first group including at least one most significant bit (MSB) shift register from among the plurality of shift registers, the first group outputting the master bit, a second group including at least one least significant bit (LSB) shift register from among the plurality of shift registers, the second group outputting the second control value, and a third group including at least one remaining shift register from among the plurality of shift registers, except for the at least one shift register belonging to each of the first and second groups, the third group outputting the first control value.

The star controller may include an internal controller configured to generate the first control value, to select the at least one core to be tested, based on the first control value, and to control the at least one core according to the test method, and an external controller configured to generate the second control value and the master bit, and to output a DUT selection signal for selecting the target DUT according to the second control value or the master bit, when an output enable signal is input to the external controller.

The star controller may further include a plurality of linear feedback shift registers in the internal and external controllers, each linear feedback shift register including a multiplexer and a flip-flop.

BRIEF DESCRIPTION OF THE DRAWINGS

Features will become apparent to those of ordinary skill in the art by describing in detail exemplary embodiments with reference to the attached drawings, in which.

DETAILED DESCRIPTION

Figure 1:
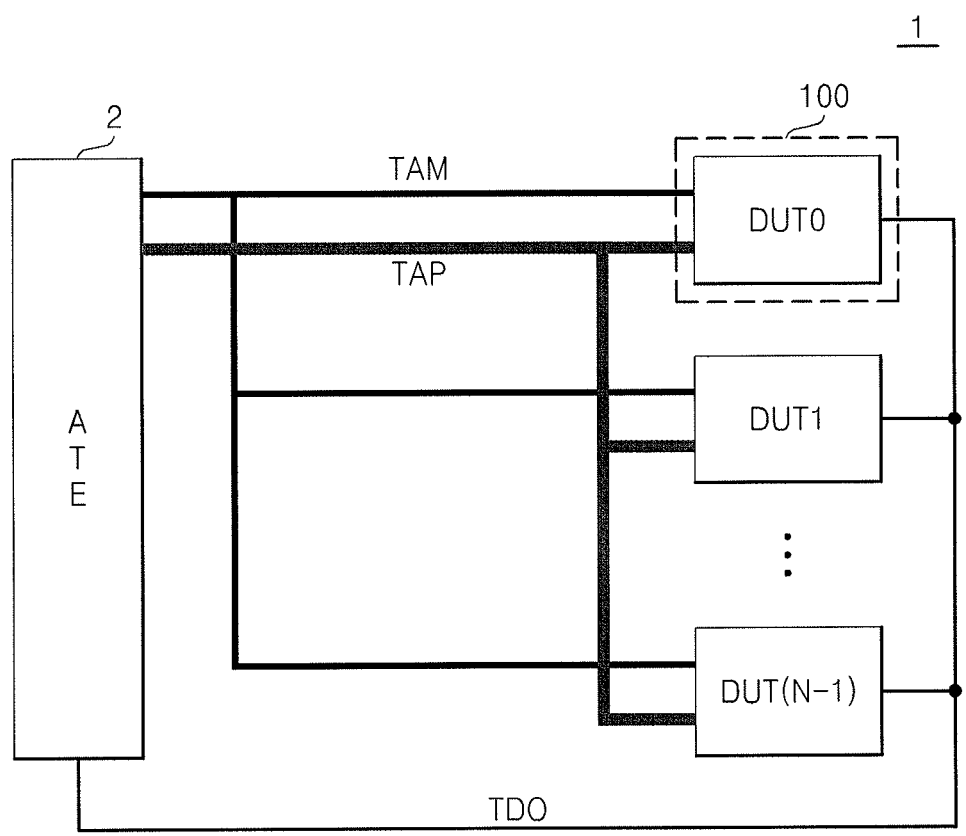
FIG. 1 illustrates a block diagram of a semiconductor test system according to an embodiment of the inventive concept.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when an element is referred to as being "between" two elements or "connected to" an element, it can be the only element between the two elements or connected to the element, one or more intervening elements may also be present. Like reference numerals refer to like elements throughout.

For a test, a plurality of cores is designed to support joint test action group (JTAG) and to conform to IEEE 1149.1 standards. A system on chip (SoC) that includes the plurality of cores and that is a test target is also referred to as a device under test (DUT).

According to the IEEE 1149.1 standards, four test input pins and one test output pin are used to test/debug cores. The four test input pins are a test data input (TDI) pin, a test clock (TCK) signal input pin, a test mode signal (TMS) input pin, and a test reset (TRST) signal input pin. The test output pin is a test data out (TDO) pin.

An operating mode of a core that is subject to the IEEE 1149.1 standards is set according to a test mode signal TMS, is reset according to a test reset signal TRST, and test data is input to or output from the core according to a test clock signal TCK. Also, test input data is received via the TDI pin and test data output is output via the TDO pin. According to this mechanism, it is possible to operate a particular internal logic of the core or write data to an internal memory of the core by using a few input/output (I/O) pins TAP, without having to use the original signal pins of the core. This mechanism has been mainly used for debugging by hardware developers, and is employed in the present invention to test DUTs.

For convenience of explanation, a SoC will be hereinafter referred to as a DUT, i.e., a device under test. Exemplary embodiments of the inventive concept will now be described with reference to the accompanying drawings.

FIG. 1 is a block diagram of a semiconductor test system 1 according to an embodiment of the inventive concept. Referring to FIG. 1, the semiconductor test system 1 may include at least one automatic test equipment (ATE) 2 and a plurality of DUTs 100.

The at least one ATE 2 is at least one test device according to IEEE standards for testing whether a plurality of cores included in each of the plurality of DUTs 100 operate exactly according to characteristics thereof. The at least one ATE 2 is connected to the plurality of DUTs 100 via five channels. The at least one ATE 2 includes four input pins for receiving a test data input signal TDI, a test mode input signal TMI, a test clock signal TCK, and a test reset signal nTRST, and one output pin for outputting a test data output TDO.

Each of the plurality of DUTs 100 is a test target device that includes a plurality of cores having various functions. For example, each of the plurality of DUTs 100 may be, e.g., a SoC, a microprocessor, a very large-scale-integration (VLSI) device, or the like. The plurality of DUTs 100 are connected to the at least one ATE 2 via the five channels, i.e., the four inputs and one output, according to the IEEE 1149.1 standards.

Figure 2:
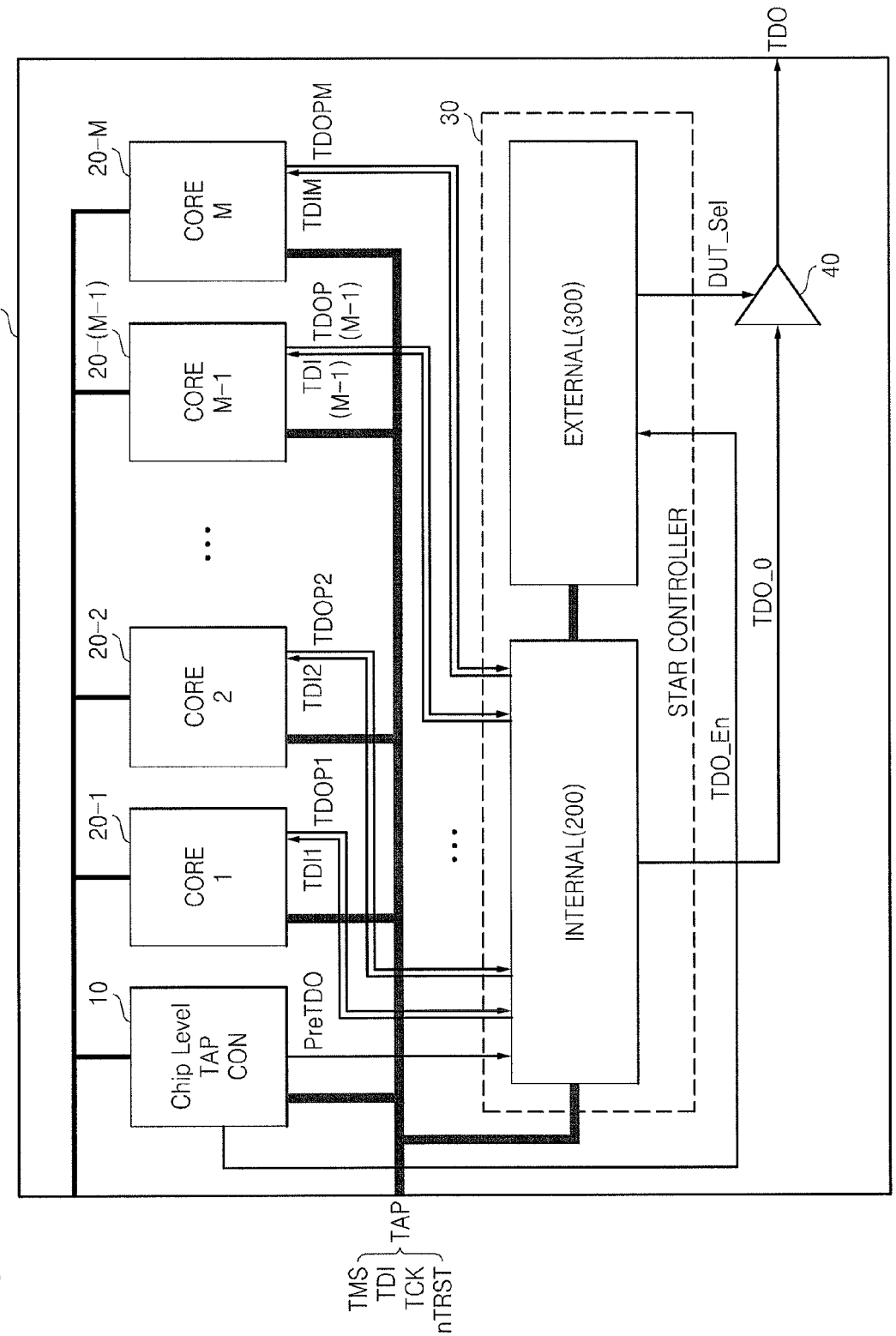
FIG. 2 illustrates an internal structure of a DUT in FIG. 1, according to an embodiment of the inventive concept.

FIG. 2 is a block diagram of an internal structure of one of the plurality of DUTs 100 of FIG. 1, according to an embodiment of the inventive concept. Referring to FIG. 2, the DUT 100 may include five I/O pins, a chip-level tap controller 10, a plurality of cores, e.g., M cores 20-1 to 20-M, a star controller 30, and a 3-phase buffer 40.

The five I/O pins are five channel interfaces connected to the at least one ATE 2 of FIG. 1. The five I/O pins include four input pins for receiving a test data input signal TDI, a test mode input signal TMI, a test clock signal TCK, and a test reset signal nTRST, respectively, and one output pin for outputting a test data output TDO.

A test access mechanism (TAM) is a channel used as a path for delivering test data, and is connected to at least one core of the M cores 20-1 to 20-M to receive the test data from the at least one ATE 2 and provide the test data to the at least one core. A number of TAMs and a width of each of the TAMs may be determined according to a test scheduling method, and may also be determined according to a number of chains of each of the M cores 20-1 to 20-M, a maximum chain length, a number and types of I/O pins, and a number of test patterns.

The chip-level tap controller 10 controls an entire test process including transmitting a test command, a test data output PreTDO, and an output enable signal TDO_En, based on these input signals.

The M cores 20-1 to 20-M perform operations corresponding to the input signals TCK, nTRST, TMS, and TDI1 to TDIM received from the input pins connected to the at least one ATE 2, and then output test data outputs TDOP1 to TDOPM, respectively. The DUT 100 includes a plurality of cores, e.g., the M cores 20-1 to 20-M. The plurality of cores may include cores according to the IEEE 1500 standards, cores according to the IEEE 1149.1 standards, or a test data register that is controlled by the chip-level tap controller 10.

The star controller 30 may include a plurality of shift registers, an internal controller 200, and an external controller 300. The star controller 30 controls a shift operation to be performed on the test data input signal TDI and the test mode input signal TMI to obtain a first control value ISTAR and a second control value ESTAR, according to the test clock signal TCK and the test reset signal nTRST, controls selection of at least one core from among the M cores 20-1 to 20-M, based on the first control value ISTAR, controls the selected one core to be tested according to the test method, and then controls the DUT 100 to output a test data output TDO, based on the second control value ESTAR and the output enable signal TDO_En.

Figure 3:
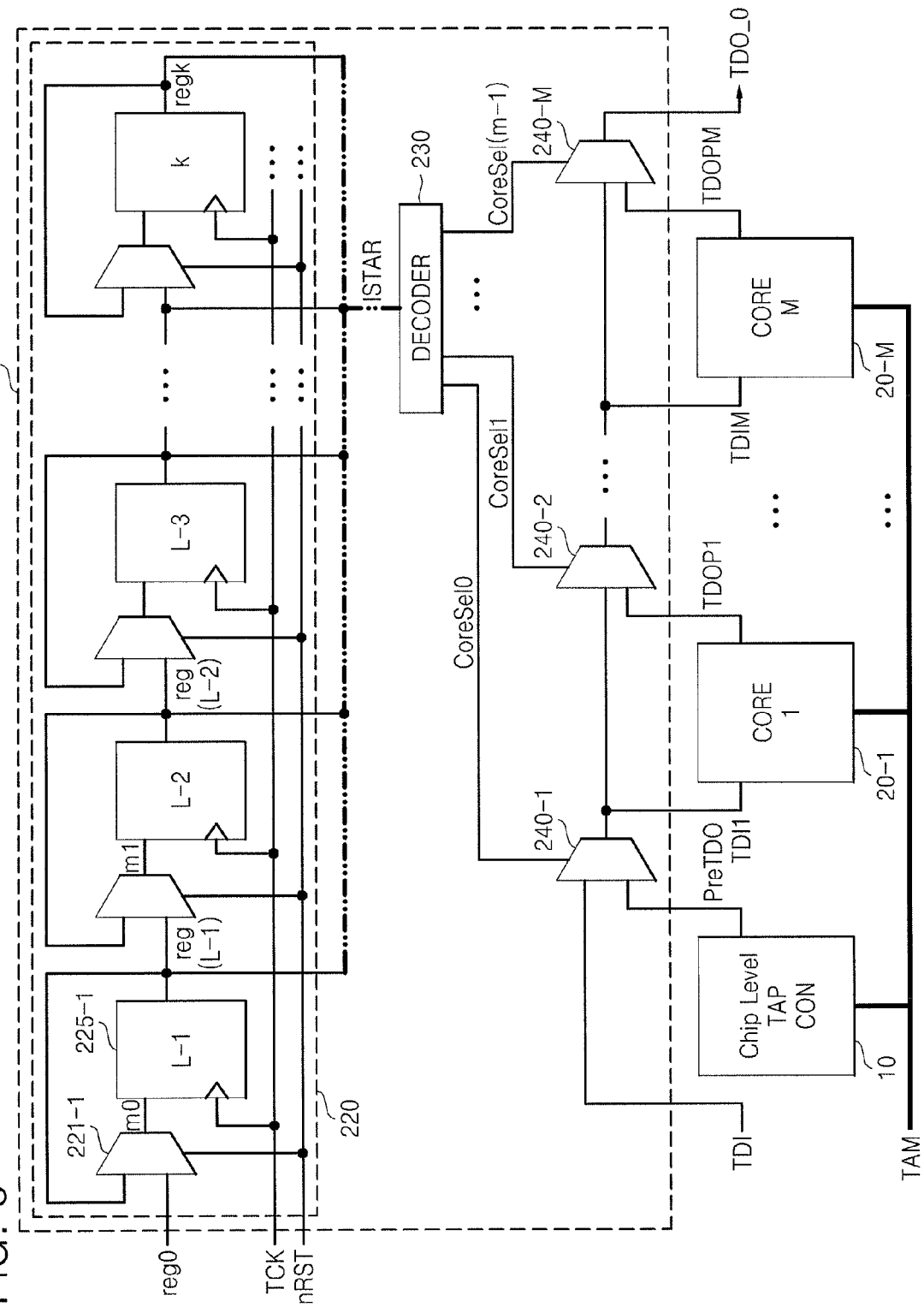
FIG. 3 illustrates a block diagram of an internal controller in FIG. 2, according to an embodiment of the inventive concept.
Figure 4:
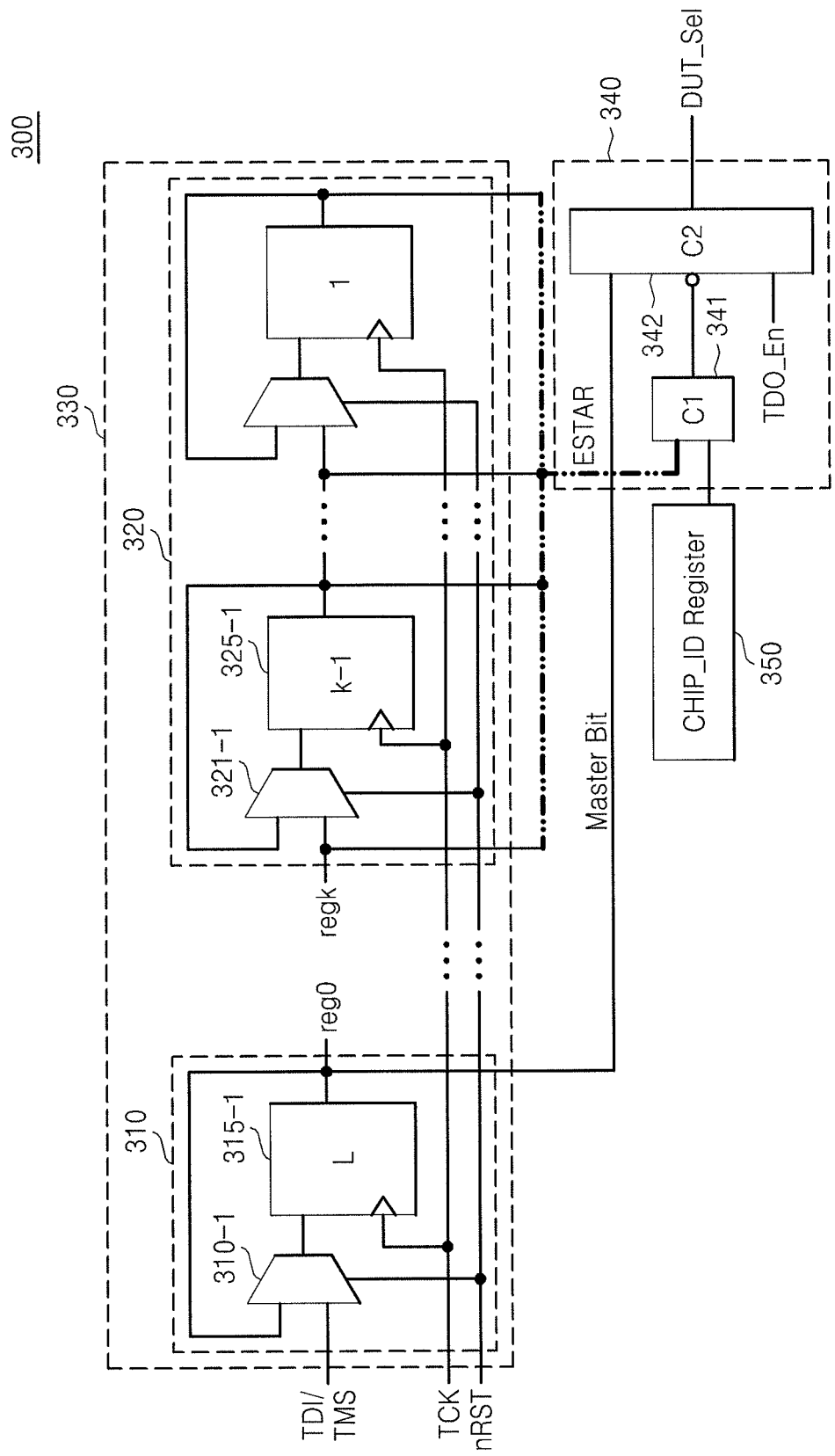
FIG. 4 illustrates a block diagram of an external controller in FIG. 2, according to an embodiment of the inventive concept.

As illustrated in FIGS. 3-4, the plurality of shift registers of the star controller 30 includes first and second groups 310 and 320 in the external controller 300, and a third group 220 in the internal controller 200. The plurality of shift registers includes a plurality of flip flops for performing the shift operation on the test input data signal TDI and the test mode input signal TMI, according to the test clock signal TCK and the test reset signal nTRST received via the four input pins. For example, the shift operation may be a linear feedback shift operation.

The first group 310 includes at least one most significant bit (MSB) shift register in the external controller 300 from among the plurality of shift registers, and outputs a master bit. The second group 320 includes at least one least significant bit (LSB) shift register in the external controller 300 from among the plurality of shift registers, and outputs the second control value ESTAR which is multi-bits. The third group 220 includes at least one remaining shift register from among the plurality of shift registers, which is in the internal controller 200 and does not belong to the first and second groups, and outputs the first control value ISTAR that is multi-bits. These shift registers will be described in detail with reference to FIGS. 3 and 4 below.

The internal controller 200 controls selection of at least one core from among the M cores 20-1 to 20-M, selection of a test method, and testing of the selected core according to the selected test method.

The external controller 300 controls the selected DUT 100 when the output enable signal TDO_En is input to the external controller 300, and the test data output TDO of the selected DUT 100 to be output to the at least one ATE 2.

The 3-phase buffer 40 is subject to the IEEE 1149.1 standards. The 3-phase buffer 40 receives a test data output TDO_0 from the internal controller 200 and a DUT selection signal DUT_Sel from the external controller 300, and outputs the test data output TDO_0 as a test data output TDO signal to the at least one ATE 2, according to the DUT selection signal DUT_Sel.

FIG. 3 is a block diagram of the internal controller 200 illustrated in FIG. 2, according to an embodiment of the inventive concept. Referring to FIG. 3, the internal controller 200 may include the third group 220, a decoder 230, and a multiplexer 240. The third group 220 generates the first control value ISTAR, and includes at least one remaining register from among the plurality of shift registers, except for the registers that belong to the first and second groups 310 and 320 and that are shared by the external controller 300. More specifically, bits obtained by performing a shift operation on a register output signal, e.g., on a register output signal $reg_0$, received from each preceding shift register and by supplying a result of the shift operation to a following register of the third group 220 are output as the first control value ISTAR via one bus (not shown), according to a test clock signal TCK and a test reset signal nTRST.

The shift operation may be a linear feedback shift operation. The linear feedback shift operation will now be described with respect to, for example, an $(L-2)^{th}$ register stage. An $(L-1)^{th}$ register stage further includes a first multiplexer 221-1. For example, a register output signal $reg_{(L-1)}$ output from an $(L-1)^{th}$ register and a register output signal $reg_{(L-2)}$ fed back from a following $(L-2)^{th}$ register are supplied to the first multiplexer 221-1. The first multiplexer 221-1 selects one of the register output signal $reg_{(L-1)}$ and the fed back register output signal $reg_{(L-2)}$, and outputs the selected signal as an input signal ml to the $(L-2)^{th}$ register, according to the test reset signal nRST.

If the test reset signal nRST is in an activation state (reset state), e.g., logic 'low', the register output signal $reg_{(L-1)}$ output from the preceding register stage is shifted to the $(L-2)^{th}$ register according to the test clock signal TCK. If the test reset signal nTRST is in a deactivation state, e.g., logic 'high', the fed back register output signal $reg_{(L-2)}$ is supplied again to the $(L-2)^{th}$ register, according to the test clock signal TCK. The linear feedback shift operation is repeatedly performed on each of the register stages according to the test clock signal TCK, as described above. The linear feedback shift operation may be also performed on the first group 310 and the second group 320 as described above.

The decoder 230 decodes the first control value ISTAR and then outputs core selection signals CoreSel0 to CoreSel(m−1). A number of the core selection signals CoreSel0 to CoreSel(m−1) may be $log_2 M$.

The internal controller 200 may further include second multiplexers 240-1 to 240-M to select and test at least one core from among the M cores 20-1 to 20-M. The second multiplexers 240-1 to 240-M connect the M cores 20-1 to 20-M in a daisy-chain fashion. More specifically, each of the second multiplexers 240-1 to 240-M may bypass a test data output received from a preceding core or supply the test data output to a current core connected to the preceding core in the daisy-chain fashion, according to a core selection signal CoreSel. In this case, the core selection signal CoreSel controls the second multiplexer 240-1 to select at least one core from among the M cores 20-1 to 20-M, and thus, inter-operations between the at least one core may be tested.

The internal controller 200 receives test input data TDI and a test mode signal TMS, tests at least one core according to the test clock signal TCK and the test reset signal nTRST, and then outputs a test data output TDO_0 as a result of the test.

FIG. 4 is a block diagram of the external controller 300 illustrated in FIG. 2, according to an embodiment of the inventive concept. Referring to FIG. 4, the external controller 300 includes the registers belonging to the first group 310 and the second group 320, a chip identification (ID) register 350, and a comparing unit 340.

The first group 310 includes at least one shift register corresponding to a MSB from among a plurality of registers shared by the external controller 300 and the internal controller 200. The at least one MSB shift register of the first group 310 outputs a master bit obtained by performing a shift operation, i.e., a register output signal $reg_0$, according to a test clock signal TCK and a test reset signal nTRST. The master bit is used to determine whether the DUT 100 of FIG. 2 is to be selected, when an output enable signal TDO_En is received. For example, it is possible to control the DUT 100 to be selected, regardless of a second control value ESTAR obtained by performing the shift operation, by using the at least one shift register of the second group 320. As another example, the master bit may be used to control the DUT 100 not to be selected, regardless of the second control value ESTAR.

The second group 320 includes at least one shift register corresponding to an LSB from among the plurality of registers shared by the external controller 300 and the internal controller 200. The at least one LSB register of the second group 320 receives a register signal $reg_k$ from a last register from among the at least one register of the third group 220, performs the shift operation on the register signal $reg_k$, and then outputs the second control value ESTAR, according to the test clock signal TCK and the test reset signal nTRST. The second control value ESTAR is obtained by outputting resultant bits that are respectively output from the at least one register of the second group 320, via one bus (not shown). In this case, shift operations performed on the first group 310 and the second group 320 are the same as the shift operation performed on the third group 220.

The chip ID register 350 stores a chip ID CHIP_ID of the DUT 100 of FIG. 2. According to an embodiment of the inventive concept, the chip ID register 350 may be embodied as a laser fuse or an electrical fuse.

When an output enable signal TDO_EN is supplied to the comparing unit 340 from the chip-level tap controller 10, the comparing unit 340 compares the chip ID CHIP_ID with the second control value ESTAR, and outputs a DUT selection signal DUT_Sel. The comparing unit 340 includes a first comparator c1 341 and a second comparator c2 342.

The first comparator 341 compares the chip ID CHIP_ID with the second control value ESTAR. If the second control value ESTAR is the same as the chip ID CHIP_ID, a test data output TDO_0 is controlled to be output from a DUT 100 corresponding to the chip ID CHIP_ID. However, if the second control value ESTAR is not the same as the chip ID CHIP_ID, the test data output TDO_0 is controlled not to be output from the DUT 100 corresponding to the chip ID CHIP_ID. For example, the first comparator 341 may be a XOR gate.

The second comparator 342 outputs either the master bit or a result of the comparing performed by the first comparator 341, as the DUT selection signal DUT_Sel, according to the output enable signal TDO_EN. For example, the second comparator 342 may be an AND gate.

Thus, even if the at least one ATE 2 of FIG. 1 includes one TDO pin, the at least one ATE 2 may receive the test data output TDO from the DUT 100 from among the plurality of DUTs 100 and check a result of testing the DUT 100, according to the DUT selection signal DUT_Sel. Accordingly, since a number of I/O pins may be reduced and multi-tests may be performed by sharing an output channel of the at least one ATE 2, an overhead, test costs, and a test time may be reduced.

Figure 5:
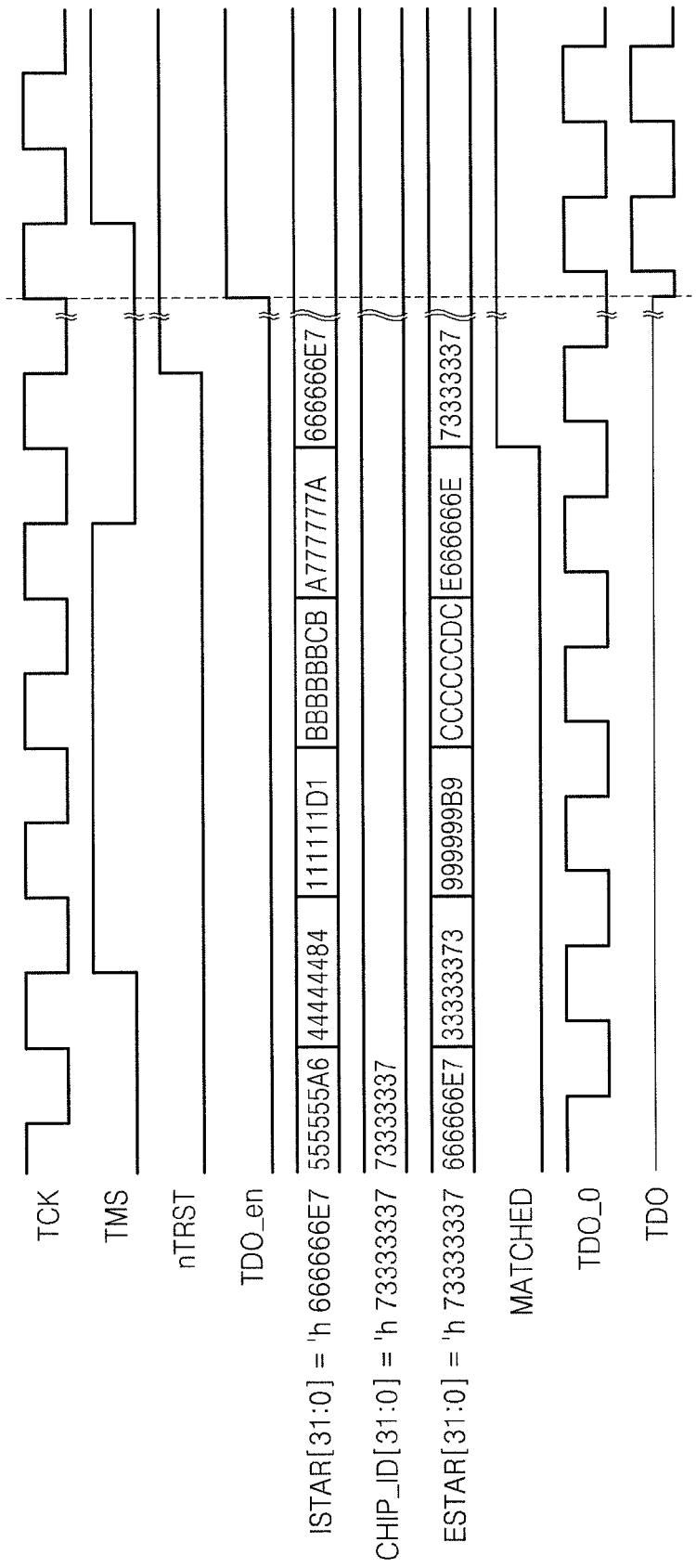
FIG. 5 illustrates a timing diagram of signals when the DUT of FIG. 2 is tested, according to an embodiment of the inventive concept.

FIG. 5 is a timing diagram of signals when the DUT 100 of FIG. 2 is tested, according to an embodiment. Referring to FIG. 5, four input signals are supplied from the at least one ATE 2 of FIG. 1 to the DUT 100. In other words, a test mode signal TMS and test input data TDI are supplied to the core 20-1 and the star controller 30 under control of the chip-level tap controller 10, according to a test clock signal TCK.

The internal controller 200 receives the test mode signal TMS and the test input data TDI, performs a shift operation on the test mode signal TMS and the test input data TDI by using the at least one register belonging to the second group 220 of FIG. 3, and then outputs resultant bits output from the at least one register as a first control value ISTAR, via a bus (not shown), according to the test control signal TCK. Referring to FIG. 5, the shift operation is performed on the first control value ISTAR whenever the test clock signal TCK goes to logic 'high'.

The external controller 300 performs the shift operation on the first control value ISTAR '666666E7' received from the at least one register belonging to the second group register 220 by using the at least one register belonging to the third group 320, and outputs resultant bits output from the at least one register as a second control value ESTAR, via the bus. Referring to FIG. 5, in this case, if a chip ID CHIP_ID is the same as the second control value ESTAR, a signal MATCHED indicating that the second control value ESTAR matches the chip ID CHIP_ID 'h 7333337' is supplied to the second comparator 342 of FIG. 4.

When an output enable signal TDO_En is supplied to the second comparator 342, the signal MATCHED is supplied as a DUT selection signal DUT_Sel to the 3-phase buffer 40. In this case, the output enable signal TDO_En is enabled, e.g., to a logic 'high' state, when a test reset signal nTRST is deactivated, e.g., to the logic 'high' state, and after a predetermined cycle of the test clock signal TCK.

The 3-phase buffer 40 outputs a high-z signal before the DUT selection signal DUT_Sel is supplied to the 3-phase buffer 40 from the chip-level tap controller 10, and outputs the test data output TDO to the at least one ATE 2 when a test data output TDO_0 is supplied as the DUT selection signal DUT_Sel to the 3-phase buffer 40 from at least one core 20 selected by the internal controller 200.

Figure 6:
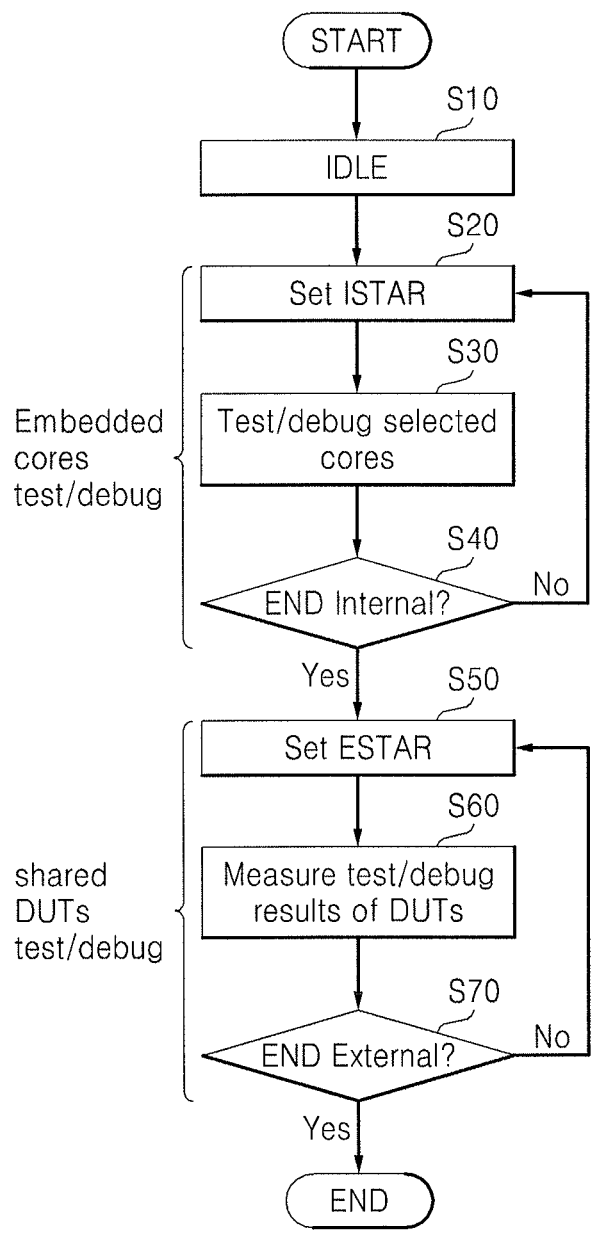
FIG. 6 illustrates a flowchart of a test method according to an embodiment of the inventive concept.

FIG. 6 is a flowchart illustrating a test method according to an embodiment of the inventive concept. Referring to FIGS. 2 and 6, the DUT 100 receives input signals from the at least one ATE 2 of FIG. 1 via four input channels (operation S10).

Specifically, in operation S10, the DUT 100 provides the plurality of shift registers to the star controller 30, so as to test a plurality of cores 20-1 to 20-(M−1) included in the DUT 100, and then supplies test input data TDI, a test mode input signal TMS, a test clock signal TCK, and a test reset signal nTRST to the plurality of shift registers and the plurality of cores 20-1 to 20-(M−1).

In this case, the plurality of shift registers are within the first group 310 that includes at least one MSB shift register from among the plurality of shift registers and outputs a master bit, the second group 320 that includes at least one LSB shift register from the plurality of shift registers and outputs the second control value ESTAR, and the third group 220 that includes at least one remaining shift register that does not belong to the first and second groups 310 and 320 and outputs the first control value ISTAR.

Then, the DUT 100 outputs the first control value ISTAR by performing a shift operation by using the at least one shift register belonging to the third group 320 (operation S20).

Then, at least one core selected from among the plurality of cores 20-1 to 20-(M−1) according to the first control value ISTAR is tested and debugged according to a selected test method (operation S30). Then, a test data output TDO_0 that is a result of the testing is output (operation S40).

In order to output the test data output TDO_0 from the DUT 100 to the at least one ATE 2, the master bit or the second control value ESTAR is output by performing the shift operation by using the at least one shift register of the first group 310 or the second group 320 (operation S50). The DUT 100 outputs the DUT selection signal DUT_Sel based on the master bit or the second control value ESTAR. When the output enable signal TDO_En is supplied to the DUT 100, the DUT 100 outputs the test data output TDO_0 to the at least one ATE 2 to check a result of the testing performed in operation S30 (operations S60 and S70).

Figure 7:
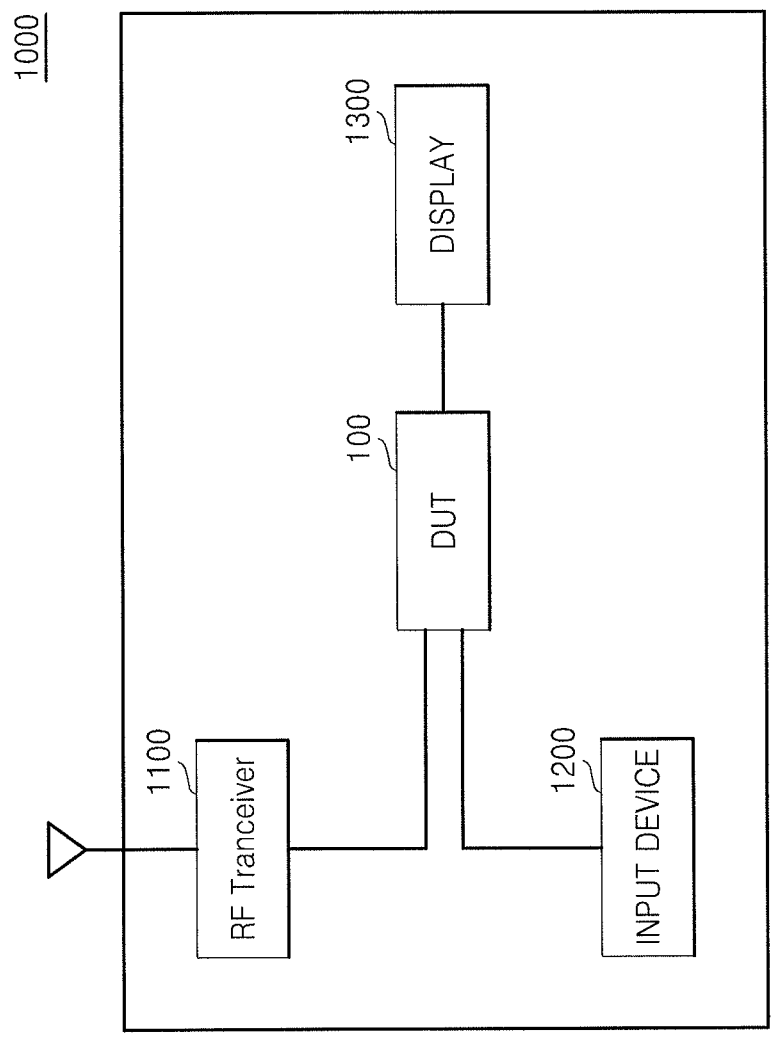
FIG. 7 illustrates a block diagram of a semiconductor system including the DUT of FIG. 1 according to some embodiments of the inventive concept.

FIG. 7 is a block diagram of a semiconductor system including the DUT illustrated in FIG. 1 according to some embodiments. Referring to FIG. 7, the semiconductor system 1000 includes the DUT 100 illustrated in FIG. 1, an antenna, a radio transceiver 1100, an input device 1200, and a display 1300.

The radio transceiver 1100 transmits or receives radio signals through an antenna. The radio transceiver 1100 may convert radio signals received through the antenna into signals that can be processed by the DUT 100. Accordingly, the DUT 100 may process the signals output from the radio transceiver 1100 and transmit the processed signals to the display 1300. The radio transceiver 1100 may also convert signals output from the DUT 100 into radio signals and output the radio signals to an external device through the antenna.

The input device 1200 enables control signals for controlling the operation of the DUT 100 or data to be processed by the DUT 100. The input device 1200 may be implemented by a pointing device, e.g., a touch pad or a mouse, a keypad, or a keyboard.

Figure 8:
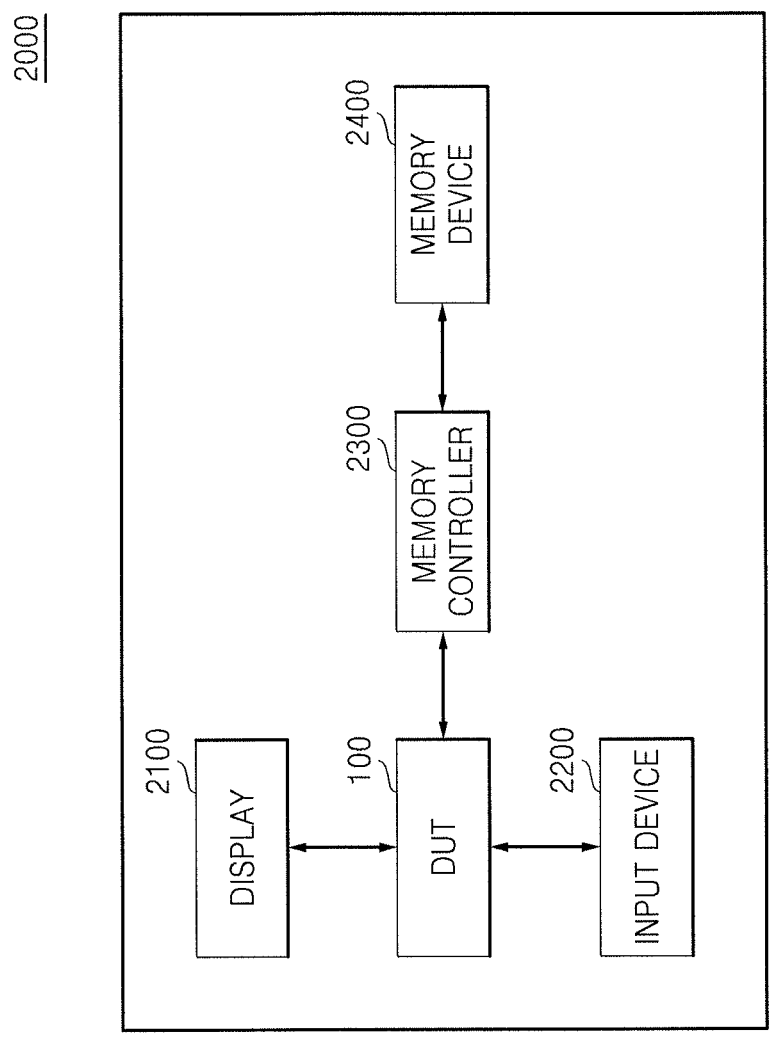
FIG. 8 illustrates a block diagram of a computer system including the DUT of FIG. 1 according to some embodiments of the inventive concept.

FIG. 8 is a block diagram of a computer system including the DUT illustrated in FIG. 1, according to some embodiments. Referring to FIG. 8, the computer system 2000 including the DUT 100 illustrated in FIG. 1 may be implemented as, e.g., a PC, a tablet PC, a net-book, an e-reader, a PDA, a portable multimedia player (PMP), an MP3 player, or an MP4 player.

The computer system 2000 includes the DUT 100, a memory device 2400, and a memory controller 2300 controlling the data processing operations of the memory device 2400, a display 2100 and an input device 2200.

The DUT 100 may display data stored in the memory device 2400 through the display 2100 according to data input through the input device 2200. The input device 2200 may be implemented by a pointing device, e.g., a touch pad or a computer mouse, a keypad, or a keyboard. The DUT 100 may control the overall operation of the computer system 2000 and the operations of the memory controller 2300. The memory controller 2300, which may control the operations of the memory device 2400, may be implemented as a part of the DUT 100 or as a separate chip.

Figure 9:
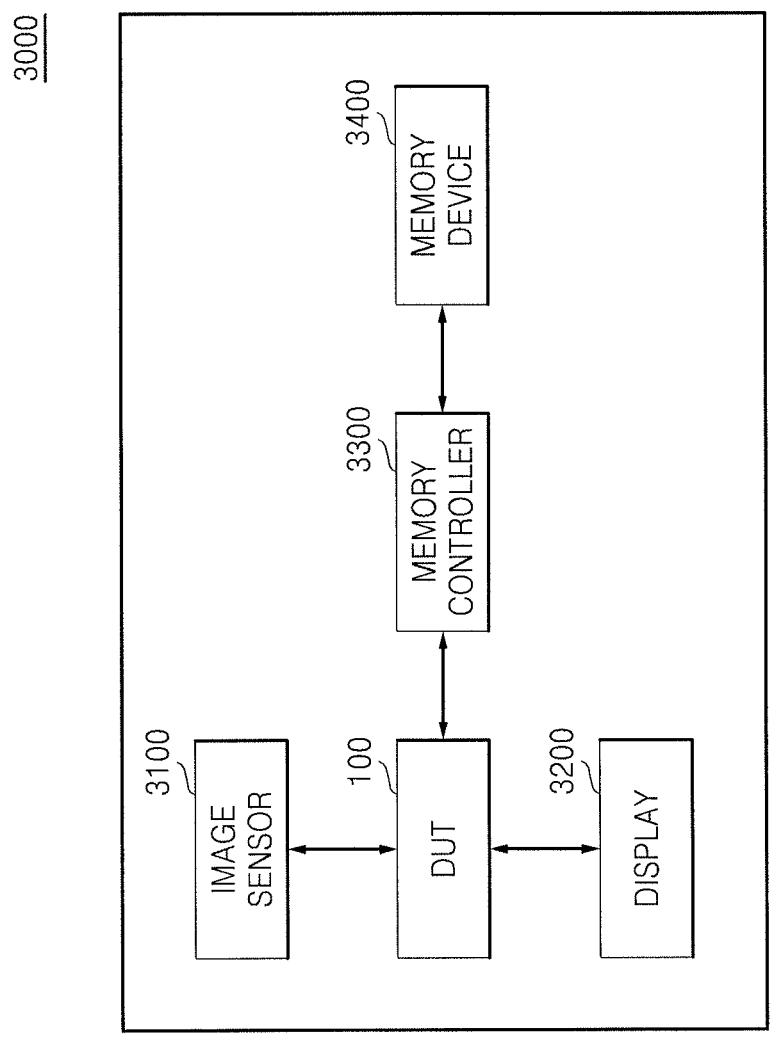
FIG. 9 illustrates a block diagram of a computer system including the DUT of FIG. 1 according to other embodiments of the inventive concept.

FIG. 9 is a block diagram of a computer system including the DUT illustrated in FIG. 1, according to other embodiments. The computer system 3000 may be implemented as an image processor, e.g., a digital camera, a cellular phone equipped with a digital camera, a smart phone equipped with a digital camera, a tablet PC equipped with a digital camera, etc.

The computer system 3000 may include the DUT 100, the memory device 3400, and a memory controller 3300 controlling the data processing operations, e.g., a program operation, an erase operation, and a read operation, of the memory device 3400. An image sensor 3100 included in the compute system 3000 converts optical images into digital signals and outputs the digital signals to the DUT 100 or the memory controller 3300. The digital signals may be controlled by the DUT 100 to be displayed through a display 3200 or stored in the memory device 3400 through the memory controller 3300.

Data stored in the memory device 3400 may be displayed through the display 3200 according to the control of the DUT 100 or the memory controller 3300. The memory controller 3300, which may control the operations of the memory device 3400, may be implemented as a part of the DUT 100 or as a separate chip.

The plurality of DUTs 100 according to an embodiment of the inventive concept may be packaged according to at least one of a through silicon via (TSV) technique, a system-in-package (SIP) technique, or a multi-chip package (MCP) technique. Recently, the TSV technique has been used to manufacture a three-dimensional (3D) chip by vertically stacking and combining the plurality of DUTs 100 by using TSVs so as to increase the density of a semiconductor memory or each of memory modules.

When the plurality of DUTs 100 are packaged according to the MCP technique, desired memories may be combined to manufacture an application product, and a mobile communication device, e.g., a mobile phone, may be manufactured while maximizing space efficiency.

To increase efficiency of the multi-site test, efficient use of channel resources for the ATE may be increased and an overhead, e.g., a test time and an index time, spent for the test may be reduced. Therefore, in a DUT according to an embodiment of the inventive concept, the number of I/O pins may be reduced based on design for testability (DFT) when performing multi-tests on DUTs by sharing an output channel of the ATE, thereby reducing an overhead, test costs, and a test time. In contrast, if the number of ATE channels is increased, as opposed to being decreased, in order to decrease overhead, the number of sites at which testing is performed is increased, thereby increasing costs for using the ATEs.

While the inventive concept has been particularly shown and described with reference to exemplary embodiments thereof, it will be understood that various changes in form and details may be made therein without departing from the spirit and scope of the following claims.

What is claimed is:

1. A method of testing a plurality of devices under test (DUTs), each DUT including a plurality of cores, the method comprising:
   providing a plurality of shift registers to test the plurality of cores;
   supplying a test input data, a test mode input signal, a test clock signal, and a test reset signal to the plurality of shift registers and the plurality of cores;
   receiving a master bit, a first control value, and a second control value which are generated by the plurality of shift registers based on the test input data and the test mode input signal, in response to the test clock signal and the test reset signal;
   selecting at least one core from among the plurality of cores and a test method, according to the first control value;
   selecting a target DUT that is to output test data output from among the plurality of DUTs, according to the master bit or the second control value; and
   simultaneously testing and debugging the selected at least one core according to the test method, and outputting the test data output of the target DUT to check a result of the testing when an output enable signal is received.

2. The method as claimed in claim 1, wherein providing the plurality of shift registers includes:
   providing a first group including at least one most significant bit (MSB) shift register from among the plurality of shift registers, the first group outputting the master bit;
   providing a second group including at least one least significant bit (LSB) shift register from among the plurality of shift registers, the second group outputting the second control value; and
   providing a third group including at least one remaining shift register from among the plurality of shift registers, except for the at least one shift register belonging to each of the first and second groups, the third group outputting the first control value.

3. The method as claimed in claim 2, wherein each of the plurality of shift registers includes a first multiplexer and a flip flop, and performs a linear feedback shift operation.

4. The method as claimed in claim 3, wherein selecting the target DUT includes:
   connecting the plurality of cores in a daisy-chain fashion; and
   selecting the at least one core and the test method according to a core selection signal obtained by decoding the first control value.

5. The method as claimed in claim 3, wherein, if the master bit is received, selecting the target DUT is performed according to the master bit when the output enable signal is received.

6. A device under test (DUT), comprising:
   four input pins to receive input signals, the input signals including a test input data signal, a test mode input signal, a test clock signal, and a test reset signal;
   one output pin to output test data output;
   a plurality of cores to execute operations corresponding to the input signals received via the four input pins, and to output the test data output;
   a chip-level tap controller to control an entire test process including transmitting a test command, the test data output, and an output enable signal based on the input signals;
   a star controller to obtain a master bit, a first control signal, and a second control signal by performing a linear feedback shift operation on the test input data signal and the test mode input signal in response to the test clock signal and the test reset signal, to select at least one core to be tested from among the plurality of cores and a test method based on the first control signal, to test the selected at least one core according to the selected test method, and to select a target DUT, which is to output the test data output, based on the second control signal or the master bit; and
   a 3-phase buffer to output the test data output of the target DUT in response to the output enable signal, wherein the star controller includes:
   a plurality of shift registers, each performing the linear feedback shift operation on the test input data signal and the test mode input signal in response to the test clock signal and the test reset signal;
   an external controller including a first group and a second group, and outputting a DUT selection signal for selecting the target DUT according to the second control signal or the master bit when the output enable signal is input to the external controller,
   wherein the first group includes at least one most significant bit (MSB) shift register from among the plurality of shift registers, and outputs the master bit, and the second group includes at least one least significant bit (LSB) shift register from among the plurality of shift registers, and outputs the second control signal; and an internal controller including a third group and a decoder, the internal controller being configured to control at least one core, which is to be tested, to be selected from among M cores, to control a test method to be selected, and to control the selected at least one core to be tested according to the test method, wherein the third group includes at least one remaining shift register from among the plurality of shift registers, except for the shift registers belonging to each of the first and second groups, and outputs the first control signal, and wherein the decoder decodes the first control signal and outputs M core selection signals.

7. The DUT as claimed in claim 6, wherein the internal controller further comprises a plurality of first multiplexers configured to connect the chip-level tap controller and the M cores, each of the plurality of first multiplexers being configured to select the at least one core to be tested from among the M cores and the test method, according to the M core selection signals.

8. The DUT as claimed in claim 7, wherein each of the plurality of first multiplexers is configured to bypass a test data output of a corresponding core from among the M cores or to supply the test data output to a following core connected to the corresponding core in a daisy-chain fashion, according to one of the M core selection signals.

9. The DUT as claimed in claim 6, wherein each of the plurality of shift registers includes a second multiplexer and a flip flop, and performs the linear feedback shift operation.

10. The DUT as claimed in claim 6, wherein, if the DUT is selected according to the second control value, the external controller further comprises:
    a chip identification (ID) register for storing a chip ID; and
    a comparator to compare the chip ID with the second control value and then outputting a DUT selection signal, when the output enable signal is input to the comparator.

11. The DUT as claimed in claim 10, wherein, if the DUT is selected according to the master bit, the comparator is to determine whether the DUT is to be selected, according to the master bit and then outputs the DUT selection signal, when the output enable signal is input to the comparing unit.

12. The DUT as claimed in claim 6, wherein the plurality of shift registers are linear feedback shift registers, the plurality of shift registers shift the test input data signal and the test mode input signal when the test reset signal is activated, and hold the test input data signal and the test mode input signal when the test reset signal is deactivated.

13. A semiconductor test system, comprising:
    an automatic test equipment; and
    a plurality of DUTs as claimed in claim 6,
    wherein the plurality of DUTs are packaged according to at least one of a through silicon via (TSV) technique, a system-in-package (SIP) technique, or a multi-chip package (MCP) technique.

14. A semiconductor system comprising at least one of the DUT as claimed in claim 6.

15. A system on chip (SoC), comprising:
    a plurality of cores to execute operations in accordance with input signals and to output test data output, the input signals including a test input data signal, a test mode input signal, a test clock signal and a test reset signal;
    a star controller to obtain a first control value a second control value and a mater bit based on the test input data signal and the test mode input signal in response to the test clock signal and the test reset signal, to select at least one core of the plurality of cores according to the first control value and determine a test method specified by the first control value, to test the selected at least one core according to the test method, and to determine whether to output the test data output of the selected at least one core based on the second control value or the master bit,
    wherein the star controller includes a plurality of shift registers configured to perform linear feedback shift operation on the test input data signal and the test mode input signal according to the test clock signal and the test reset signal, the plurality of shift registers being divided into:
    a first group including at least one most significant bit (MSB) shift register from among the plurality of shift registers, the first group outputting the master bit,
    a second group including at least one least significant bit (LSB) shift register from among the plurality of shift registers, the second group outputting the second control value, and
    a third group including at least one remaining shift register from among the plurality of shift registers, except for the at least one shift register belonging to each of the first and second groups, the third group outputting the first control value.

16. The SoC as claimed in claim 15, further comprising:
    a chip-level tap controller configured to control an entire test process including transmitting a test command, the test data output, and an output enable signal based on the input signals; and
    a 3-phase buffer configured to output the test data output in response to the output enable signal.

17. The SoC as claimed in claim 15, wherein the star controller includes:
    an internal controller configured to generate the first control value, to select the at least one core to be tested and the test method based on the first control value, and to test the at least one core according to the test method; and
    an external controller configured to generate the second control value and the master bit, and to output a DUT selection signal for selecting the target DUT according to the second control value or the master bit, when an output enable signal is input to the external controller.

18. The SoC as claimed in claim 15, wherein the plurality of shift registers are linear feedback shift registers, the plurality of shift registers shift the test input data signal and the test mode input signal when the test reset signal is activated, and hold the test input data signal and the test mode input signal when the test reset signal is deactivated.

* * * * *